(12) United States Patent
Taguwa

(10) Patent No.: US 6,432,493 B1
(45) Date of Patent: Aug. 13, 2002

(54) METHOD OF CARRYING OUT PLASMA-ENHANCED CHEMICAL VAPOR DEPOSITION

(75) Inventor: Tetsuya Taguwa, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/668,028

(22) Filed: Sep. 21, 2000

Related U.S. Application Data

(62) Division of application No. 09/052,305, filed on Mar. 31, 1998, now Pat. No. 6,167,836.

(30) Foreign Application Priority Data

Apr. 2, 1997 (JP) ............................................. 9-083695

(51) Int. Cl.[7] ................................................. H05H 1/24
(52) U.S. Cl. ..................... 427/569; 427/576; 118/723 E
(58) Field of Search .............................. 427/576, 569; 438/648, 656, 683; 118/723 R, 723 E

(56) References Cited

U.S. PATENT DOCUMENTS

| | | | | |
|---|---|---|---|---|
| 4,512,867 A | * | 4/1985 | Andreev et al. ............. 118/722 |
| 5,529,657 A | * | 6/1996 | Ishii ........................... 156/345 |
| 5,547,539 A | * | 8/1996 | Arasawa et al. ............. 427/569 |
| 5,552,124 A | | 9/1996 | Su |
| 5,562,952 A | * | 10/1996 | Nakahigashi et al. ........ 427/577 |
| 5,679,405 A | * | 10/1997 | Thomas et al. .......... 427/255.392 |
| 5,721,021 A | * | 2/1998 | Tobe et al. .................. 427/570 |
| 5,866,213 A | * | 2/1999 | Foster et al. ................ 427/573 |
| 6,270,859 B2 | * | 8/2001 | Zhao et al. ........... 427/255.394 |

FOREIGN PATENT DOCUMENTS

| | | |
|---|---|---|
| EP | 0 676 790 A1 | 10/1995 |
| EP | 0 680 075 A1 | 11/1995 |
| JP | 59-92520 | 5/1984 |
| JP | 62-37922 | 3/1987 |
| JP | 1-188678 | 7/1989 |
| KR | 10-293961 | 4/2001 |

OTHER PUBLICATIONS

Hillman et al, "Titaniium Chemical Vapor Deposition," VLSI Multilevel Interconnection Conference, 1994, pp. 365–367, XP002143262, Abstract.

* cited by examiner

*Primary Examiner*—Bret Chen
(74) *Attorney, Agent, or Firm*—Hayes Soloway P.C.

(57) ABSTRACT

A method of carrying out a plasma-enhanced chemical vapor deposition. A process gas is introduced into a reaction chamber containing a susceptor having a first region on which a semiconductor substrate is placed and a second region other than the first region, upon which a ceramics insulator is placed. A plasma is generated between the susceptor and an electrode, and a thin film is formed on the semiconductor substrate and on the ceramics insulator covering the second region of the susceptor. The resulting plasma-enhanced chemical vapor deposition results in enhanced uniformity of the thin metal film formed on the semiconductor substrate, and improved yield, and barrier characteristics.

9 Claims, 4 Drawing Sheets

METHOD OF CARRYING OUT PLASMA-ENHANCED CHEMICAL VAPOR DEPOSITION

This application is a Divisional of Ser. No. 09/052,305 filed Mar. 31, 1998, now U.S. Pat. No. 6,167,836.

BACKGROUND OF THE INVENTION

1. Field of the Invention

The invention relates to a plasma-enhanced chemical vapor deposition (PECVD) apparatus to be used for forming a thin film in a process of fabricating a semiconductor device, and more particularly to a plasma-enhanced chemical vapor deposition apparatus capable of uniformly forming a metal film having a high barrier characteristic.

2. Description of the Related Art

In these days, a design-rule in a semiconductor device is leveled up from a half-micron level to a quarter-micron level as LSI has been fabricated in a smaller size and in higher integration. In addition, techniques of forming a multi-layered wiring structure and planarizing a surface of a device makes an aspect ratio of a contact hole for connecting upper and lower wiring layers with each other higher and higher. In order to form a highly reliable multi-layered wiring structure including such a contact hole having a high aspect ratio, various methods have been used. For instance, one of such methods includes the steps of forming a titanium nitride layer acting as a barrier metal, conformal to a wiring layer for preventing diffusion of material of which the wiring layer is composed, forming an aluminum film, and thermally treating the aluminum film into fluid to thereby flow the fluidized aluminum into a contact hole. Another method includes the step of filling a contact hole with material of which an upper wiring layer is composed or a contact plug by selective chemical vapor deposition or blanket chemical vapor deposition of tungsten.

A titanium layer and a titanium nitride layer are formed generally by sputtering or reactive sputtering wherein titanium is used as a target material. Improvement has been made in these methods in order to fulfill a demand of forming a contact hole having a higher aspect ratio. That is, there have been suggested improvements in sputtering such as collimated sputtering wherein a vertical component of movement of particles obtained by sputtering is enhanced, and long throw sputtering wherein a vertical component of movement of particles obtained by sputtering by spacing a target from a substrate.

However, as an aspect ratio of a contact hole becomes higher and higher, it is difficult to form a thin film sufficiently at a bottom of a contact hole even in accordance with any one of the above-mentioned methods. In addition, in accordance with any one of the above-mentioned methods, a film is deposited at an opening of a contact hole in an over-hang shape, which exerts a harmful influence on a subsequent step of forming a wiring layer, and reduces reliability of a wiring layer formed on such a contact hole. Furthermore, any one of the above-mentioned sputtering provides a quite low film deposition rate, which reduces productivity of a thin film to be formed on a semiconductor substrate.

In order to solve the above-mentioned step coverage in sputtering, there has been suggested a plasma-enhanced chemical vapor deposition wherein a thin film is grown on a semiconductor substrate with the semiconductor substrate being heated, for instance, by J. T. Hillman et al., "Titanium Chemical Vapor Deposition", VLSI Multilevel Interconnection Conference, pp. 365–367, 1994. In the suggested plasma-enhanced chemical vapor deposition, a titanium tetrachloride gas is employed as a process gas, and a titanium layer is formed by hydrogen reduction in a parallel plate type plasma-enhanced chemical vapor deposition apparatus. A titanium nitride film is formed conformal to a semiconductor substrate through the use of reduced pressure chemical vapor deposition.

FIG. 1 illustrates a typical conventional apparatus for carrying out plasma-enhanced chemical vapor deposition. The illustrated apparatus includes a reaction chamber 11 having an inlet port 11a through which a process gas is introduced into the reaction chamber 11, and a pair of outlet ports 11b through which an exhausted gas is discharged, a susceptor 12 composed of metal for placing a semiconductor substrate 13 such as a silicon substrate thereon, an electrode 14 located in facing relation with the susceptor 12 and cooperating with the susceptor 12 to generate plasma 15 therebetween for forming a thin film on the semiconductor substrate 13 placed on the susceptor 12, and an AC voltage source 16 for providing AC voltage to the electrode 14 for generating the plasma 15 between the susceptor 12 and the electrode 14.

However, in the conventional plasma-enhanced chemical vapor deposition apparatus illustrated in FIG. 1, since there occurs an expansion in gas plasma-enhanced chemical vapor deposition. The illustrated apparatus includes a reaction distribution when the plasma 15 is generated, and a portion of the susceptor 12 which is not covered with the semiconductor substrate 13 is exposed to the plasma 15, it is quite difficult or impossible to control a temperature of the susceptor 12. As a result, portions of the susceptor 12 have different temperatures, which causes poor uniformity of a thin metal formed by plasma-enhanced chemical vapor deposition on the semiconductor substrate 13, and also causes portions of the thus formed thin film to have different electric characteristics.

Furthermore, since a titanium nitride film has a polycrystalline structure including columnar crystals, a titanium nitride film formed as a barrier metal by means of the conventional plasma-enhanced chemical vapor deposition apparatus illustrated in FIG. 1 would include a lot of crystal grains, and resultingly have a low barrier characteristic.

As another example, Japanese Unexamined Patent Publication No. 59-92520 has suggested a chemical vapor deposition apparatus including a cylindrical inner bell jar having an inner shape similar to an outer shape of an electrode situated in a reaction chamber. The bell jar is designed to be axially movable relative to the electrode.

As still another example, Japanese Unexamined Patent Publication No. 7-226378 has suggested a plasma-enhanced chemical vapor deposition apparatus including a bell jar composed of silicon nitride and located above a semiconductor substrate. A titanium/titanium nitride film is successively formed in the apparatus by employing a mixture gas of $TiCl_4$ and $H_2$ and a mixture gas of $TiCl_4$, $H_2$, and $N_2$.

The chemical vapor deposition apparatuses suggested in the above-mentioned Publications are accompanied with the same problems as mentioned above. That is, portions of a susceptor have different temperatures, which causes poor uniformity of a thin metal, and also causes portions of the thin film to have different electric characteristics. Furthermore, a titanium nitride film formed by means of the suggested chemical vapor deposition apparatuses would include a lot of crystal grains, and resultingly have a low barrier characteristic.

SUMMARY OF THE INVENTION

It is an object of the present invention to provide a plasma-enhanced chemical vapor deposition apparatus capable of enhancing uniformity in a thin film formed on a semiconductor substrate, and of improving an electric characteristic of a thin film to be used as a barrier film.

It is also an object of the present invention to provide a method of carrying out plasma-enhanced chemical vapor deposition capable of doing the same.

In one aspect of the invention, there is provided a plasma-enhanced chemical vapor deposition apparatus including (a) a reaction chamber into which a process gas is introduced and from which an exhausted gas is discharged, (b) a susceptor having a first region on which a semiconductor substrate is to be placed and a second region other than the first region, (c) an electrode located in facing relation with the susceptor and cooperating with the susceptor to generate plasma therebetween for forming a thin film on the semiconductor substrate placed on the first region of the susceptor, and (d) a ceramics insulator located between the second region of the susceptor and the plasma.

There is still further provided a plasma-enhanced chemical vapor deposition apparatus including (a) a reaction chamber into which a process gas is introduced and from which an exhausted gas is discharged, (b) a susceptor having a first region on which a semiconductor substrate is to be placed and a second region other than the first region, (c) an electrode located in facing relation with the susceptor and cooperating with the susceptor to generate plasma therebetween for forming a thin film on the semiconductor substrate placed on the first region of the susceptor, and (d) a ceramics insulator covering the second region of the susceptor therewith.

There is yet further provided a plasma-enhanced chemical vapor deposition apparatus including (a) a reaction chamber into which a process gas is introduced and from which an exhausted gas is discharged, (b) a susceptor having a first region on which a semiconductor substrate is to be placed and a second region other than the first region, (c) an electrode located in facing relation with the susceptor and cooperating with the susceptor to generate plasma therebetween for forming a thin film on the semiconductor substrate placed on the first region of the susceptor, (d) a susceptor cover composed of ceramics insulating material and covering the second region of the susceptor therewith, and (e) a partition member composed of ceramic insulating material for partitioning an inner wall of the reaction chamber and the plasma from each other.

It is preferable that the susceptor cover and the partition member are composed of the same material.

There is still yet further provided a plasma-enhanced chemical vapor deposition apparatus including (a) a reaction chamber into which a process gas is introduced and from which an exhausted gas is discharged, (b) a susceptor having a first region on which a semiconductor substrate is to be placed and a second region other than the first region, (c) an electrode located in facing relation with the susceptor and cooperating with the susceptor to generate plasma therebetween for forming a thin film on the semiconductor substrate placed on the first region of the susceptor, and (d) a susceptor cover composed of ceramics insulating material, and having a first portion covering the second region of the susceptor therewith and a second portion extending between an inner wall of the reaction chamber and the plasma for partitioning them from each other.

The second portion of the susceptor cover may be designed to further extend between an end of the electrode and the inner wall of the reaction chamber.

There is further provided a plasma-enhanced chemical vapor deposition apparatus including (a) a reaction chamber into which a process gas is introduced and from which an exhausted gas is discharged, (b) a susceptor having a first region on which a semiconductor substrate is to be placed and a second region other than the first region, (c) an electrode located in facing relation with the susceptor and cooperating with the susceptor to generate plasma therebetween for forming a thin film on the semiconductor substrate placed on the first region of the susceptor, and (d) a bell-jar shaped susceptor cover composed of ceramics insulating material, the bell-jar shaped susceptor cover having a bottom end open to the electrode and extending between an inner wall of the reaction chamber and the plasma for partitioning them from each other, and a top end covering the second region of the susceptor therewith and formed with an opening coextensive with the first region of the susceptor.

It is preferable that the bottom end of the bell-jar shaped susceptor cover further extends between an end of the electrode and the inner wall of the reaction chamber. It is preferable that the bell-jar shaped susceptor cover has a cross-section similar to a cross-section of the electrode.

It is preferable that the ceramics insulator or ceramics insulating material is composed of silicon nitride, or a-material containing oxygen therein such as quartz.

In another aspect of the invention, there is provided a method of carrying out plasma-enhanced chemical vapor deposition, including the steps of (a) introducing a process gas into a reaction chamber, (b) generating a plasma between a susceptor having a first region on which a semiconductor substrate is placed and a second region other than the first region, and an electrode located in facing relation with the susceptor so that the second region of the susceptor is partitioned from the plasma, and (c) discharging an exhausted gas out of the reaction chamber.

It is preferable that a thin film formed on the semiconductor substrate in the step (b) contains metal or metal alloy therein, preferably titanium or titanium nitride.

There is further provided a method of carrying out plasma-enhanced chemical vapor deposition, including the steps of (a) introducing a process gas into a reaction chamber, (b) generating a plasma between a susceptor having a first region on which a semiconductor substrate is placed and a second region other than the first region, and an electrode located in facing relation with the susceptor so that both the second region of the susceptor and an inner wall of the reaction chamber are partitioned from the plasma, and (c) discharging an exhausted gas out of the reaction chamber.

There is still further provided a method of carrying out plasma-enhanced chemical vapor deposition, including the steps of (a) introducing a process gas into a reaction chamber, (b) generating a plasma between a susceptor having a first region on which a semiconductor substrate is placed and a second region other than the first region, and an electrode located in facing relation with the susceptor so that both the second region of the susceptor and an inner wall of the reaction chamber are partitioned from the plasma and that an end of the electrode is partitioned from the inner wall of the reaction chamber, and (c) discharging an exhausted gas out of the reaction chamber.

In accordance with the present invention, a second portion of a susceptor is covered with a ceramics insulating material. Hence, it is possible to avoid the second portion of the susceptor from being directly exposed to plasma, which allows a temperature of the susceptor to be readily controlled. As a result, there is generated no dispersion in a temperature of the susceptor, namely, the susceptor has a common temperature in all portions thereof. Accordingly, a thin film formed on a semiconductor substrate has adequate uniformity, which ensures an enhanced device performance and an enhanced fabrication yield.

It would be possible to prevent diffusion of gas when plasma is generated, by employing an inner bell jar formed integrally with a susceptor cover, which further enhances a uniformity in a thin film formed on a semiconductor substrate.

When a titanium nitride film is to be formed on a semiconductor substrate, there is employed quartz as the ceramics insulating material. Since a titanium nitride film is grown slightly absorbing oxygen from the quartz, it is possible to prevent growth of grains, which ensures that crystal grains are significantly reduced. As a result, the formed titanium nitride film could have remarkably improved characteristics as a barrier film.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS (First Embodiment)

Figure 1:
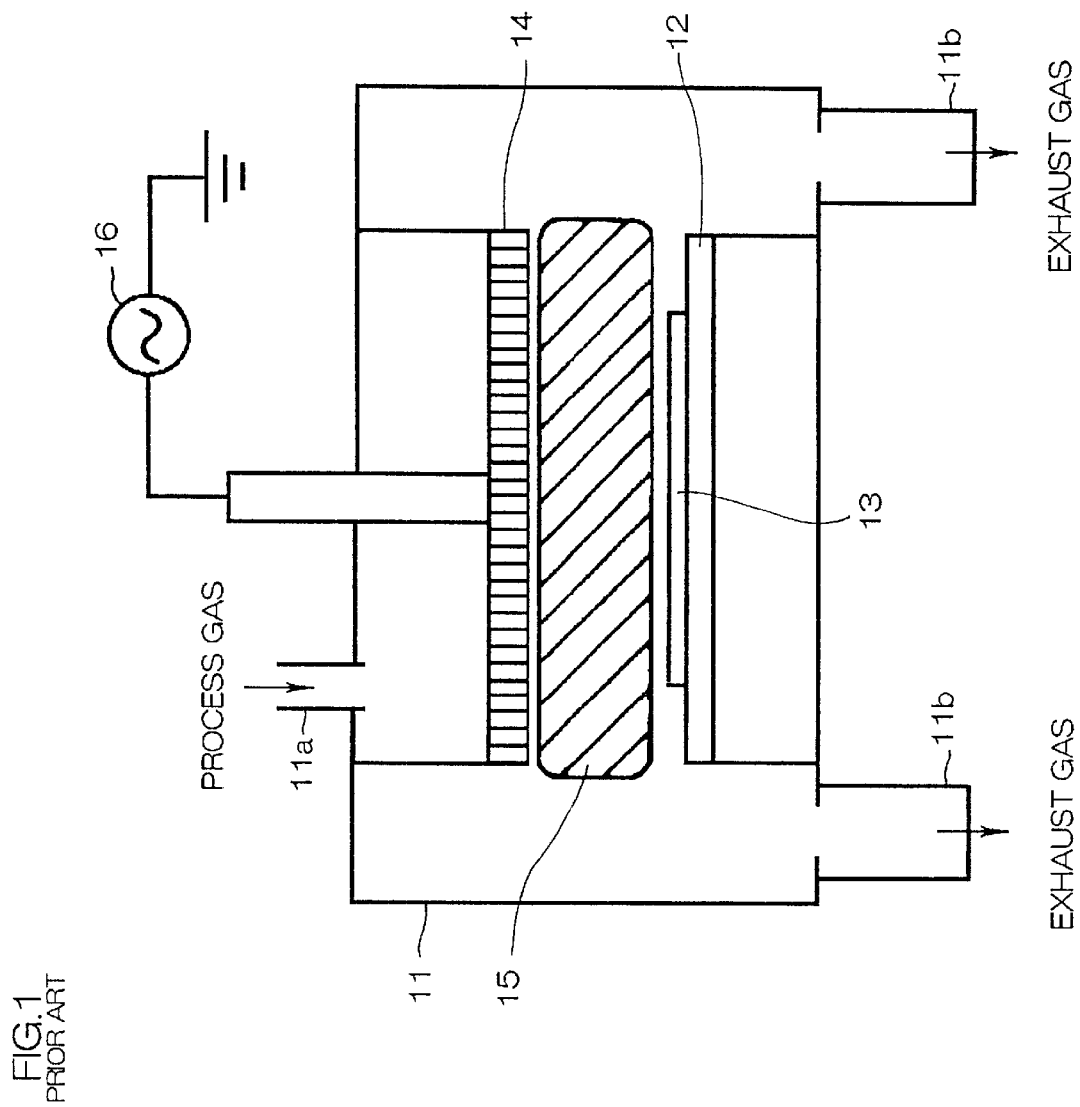
FIG. 1 is a cross-sectional view illustrating a conventional plasma-enhanced chemical vapor deposition apparatus.
Figure 2:
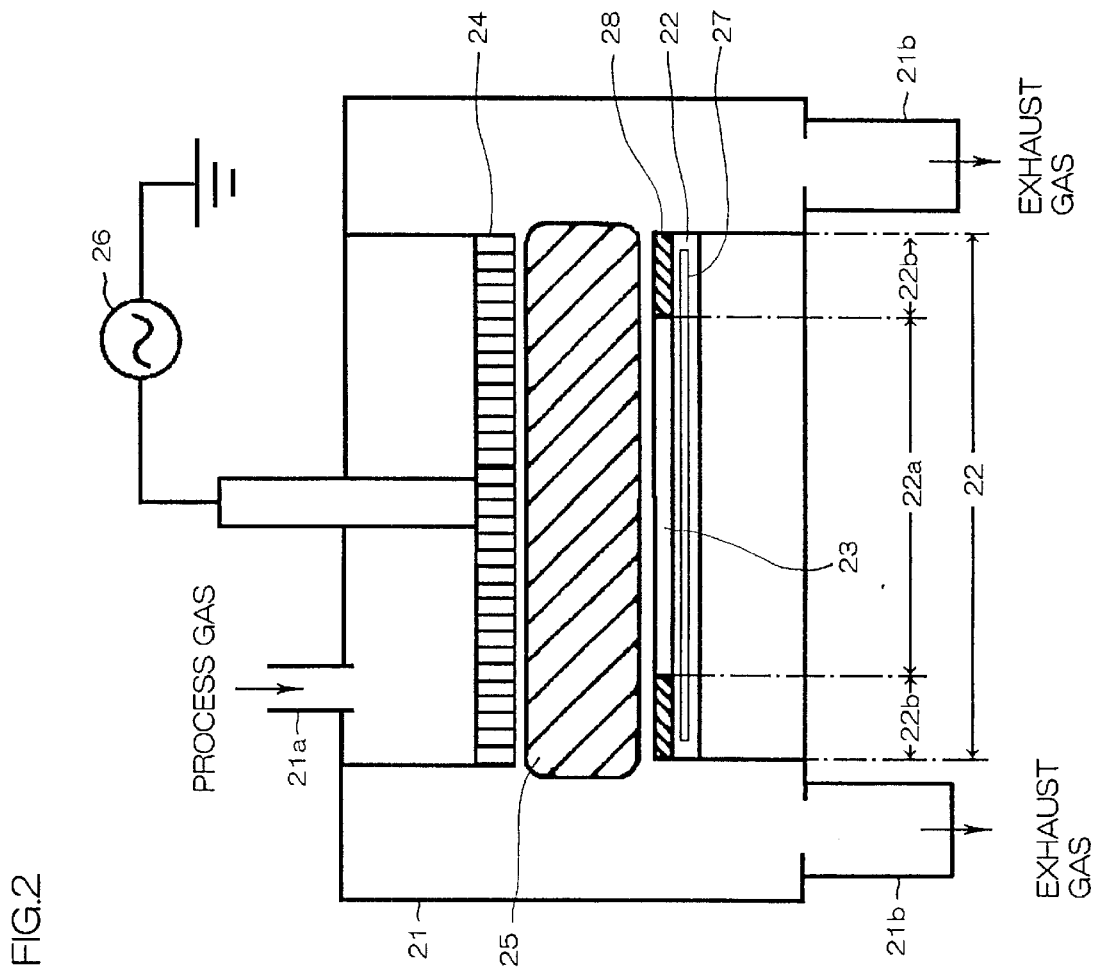
FIG. 2 is a cross-sectional view illustrating a plasma-enhanced chemical vapor deposition apparatus in accordance with the first embodiment of the present invention.

FIG. 2 illustrates a plasma-enhanced chemical vapor deposition apparatus in accordance with the first embodiment of the present invention. The illustrated plasma-enhanced chemical vapor deposition apparatus includes a reaction chamber 21 having an inlet port 21a through a process gas is introduced into the reaction chamber 21, and a pair of outlet ports 21b through which an exhausted gas is discharged, a circular-shaped susceptor 22 composed of metal for placing a semiconductor substrate 23 such as a silicon substrate thereon, an electrode 24 composed of metal and located in facing relation with the susceptor 22, and cooperating with the susceptor 22 to generate plasma 25 therebetween for forming a thin film on the semiconductor substrate 23 placed on the susceptor 22, and a radio frequency voltage source 26 for providing a radio frequency voltage to the electrode 24 for generating plasma 25 between the susceptor 22 and the electrode 24.

The electrode 24 is formed with a plurality of fine through-holes throughout a thickness thereof. The process gas introduced through the inlet port 21a is led to a space between the susceptor 22 and the electrode 24.

The susceptor 22 is designed to have a first region 22a on which the semiconductor substrate 23 is to be placed and a second region 22b other than the first region 22a. The susceptor 22 is equipped with a heater 27 which is capable of heating the semiconductor substrate 23 up to about 700 degrees centigrade.

In addition, the second region 22b of the susceptor 22 is covered with a susceptor cover 28 composed of ceramics insulating material and having an annular shape.

In the instant embodiment, the susceptor cover 28 is composed of silicon nitride. This is because silicon nitride contains no oxygen therein, and hence no oxygen is absorbed into a titanium film when the plasma 25 is generated. However, it should be noted that the susceptor cover 28 might be composed of any material, if it contains no oxygen therein.

In the instant embodiment, the susceptor cover 28 is provided so that it covers the second region 22b of the susceptor 22. However, it should be noted that there may be provided a ceramics insulator, in place of the susceptor cover 28, which is located in any location between the second region 22b of the susceptor 22 and the plasma 25 for partitioning the second region 22b from the plasma 25 to thereby prevent the second region 22b from being exposed to the plasma 25.

Hereinbelow is explained a method of forming a thin titanium film on a semiconductor substrate through the use of the above-mentioned plasma-enhanced chemical vapor deposition apparatus, with reference to FIGS. 3A to 3H.

Figure 3A:
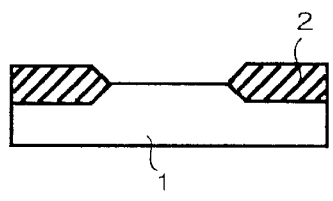
FIGS. 3A to 3H are cross-sectional views of a semiconductor device, illustrating respective steps of a method of fabricating a semiconductor device through the use of a plasma-enhanced chemical vapor deposition apparatus in accordance with the present invention.

First, as illustrated in FIG. 3A, LOCOS oxide films 2 are formed on a silicon substrate 1 by photolithography and selective oxidation.

Figure 3B:
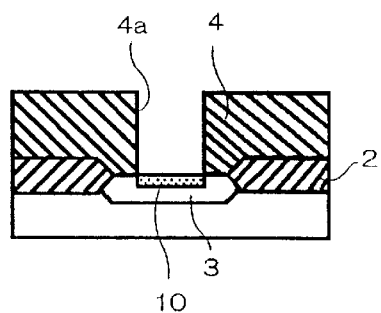

Then, the silicon substrate 1 is ion-implanted at 70 KeV with doses of $5 \times 10^{15}$ cm$^{-2}$ of boron difluoride (BF$_2$), followed by annealing at 900° C. to thereby form an electrically conductive region 3 in the silicon substrate 1, as illustrated in FIG. 3B. Then, an interlayer insulating layer 4 composed of boronphosphosilicate glass (BPSG) is formed by a thickness of 1.5 μm. Then, as illustrated in FIG. 3B, a contact hole 4a reaching the electrically conductive region 3 is formed throughout the interlayer insulating film 4 by photolithography and etching.

Figure 3C:
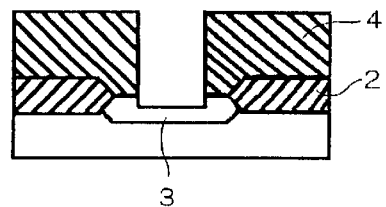

Then, as illustrated in FIG. 3C, an oxide film layer 10 formed when the contact hole 4a is formed or thereafter is etched for removal by a thickness of about 5 nm in an equivalent thickness of a thermal oxide film through the use of 1%-hydrofluoric acid as illustrated in FIG. 3C.

Figure 3D:
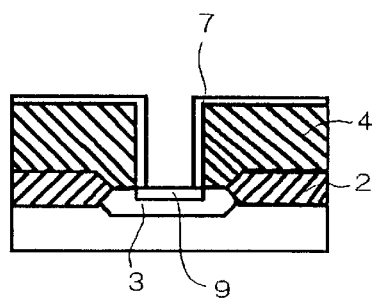

Then, the product resulting from the above-mentioned steps is transferred in the plasma-enhanced chemical vapor deposition apparatus illustrated in FIG. 2 for forming a titanium film 7 over the product, as illustrated in FIG. 3D. Since the susceptor cover 28 is composed of silicon nitride containing no oxygen therein, the susceptor cover 28 does not emit an oxygen gas, even if the susceptor cover 28 was exposed to the plasma 25. Hence, it would be possible to avoid the titanium film from absorbing oxygen thereinto. In addition, since the second region 22b of the susceptor 22 which is not covered with the semiconductor substrate 23 is covered with the susceptor cover 28, a dispersion in a temperature profile of the susceptor 22 would not be produced, even if the plasma 25 was generated. Hence, it is possible to keep the susceptor 22 to have a uniform temperature therein and further have a fixed temperature.

By forming the titanium film 7, there is also formed a titanium silicide layer 9 in the electrically conductive region 3, as illustrated in FIG. 3D.

The titanium film 7 is formed to a thickness in the range of 3 nm to 20 nm under the following conditions.

Temperature of the silicon substrate 23: 600° C.

Pressure for forming the titanium film 7: 10 Torr
Titanium tetrachloride: 5 sccm
Hydrogen: 2000 sccm
Argon: 500 sccm
RF: 200 W The use of the plasma-enhanced chemical vapor deposition apparatus illustrated in FIG. 2 considerably enhances uniformity in the titanium film 7 formed on the silicon substrate 23.

Figure 3E:
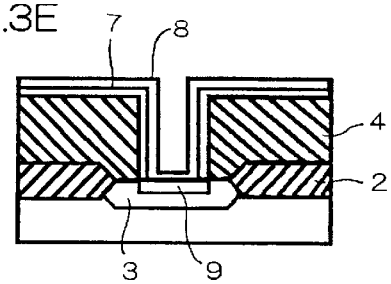
Figure 3F:
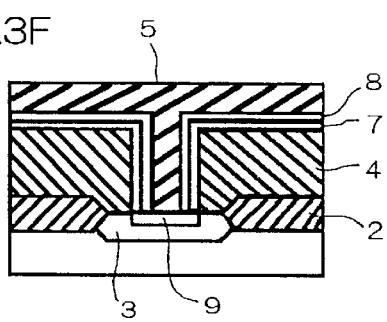
Figure 3G:
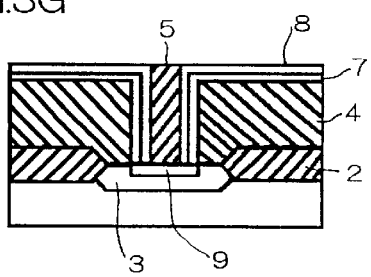

Then, as illustrated in FIG. 3E, a titanium nitride film 8 is formed entirely over the titanium film 7. Then, as illustrated in FIG. 3F, a tungsten film 5 is formed over the titanium nitride film 8 by chemical vapor deposition. Thereafter, the tungsten film 5 is etched back by dry etching using $SF_6$ and $O_2$ so that tungsten remains only in the contact hole 4a, as illustrated in FIG. 3G.

Then, after having formed an aluminum alloy film 6 over the interlayer insulating film 4 by sputtering, the aluminum film 6, the titanium nitride film 8 and the titanium film 7 are patterned into a desired pattern by means of photolithography and dry etching to thereby form an aluminum wiring layer making electrical contact with the electrically conductive region 3 through the tungsten contact plug 5.

Figure 3H:
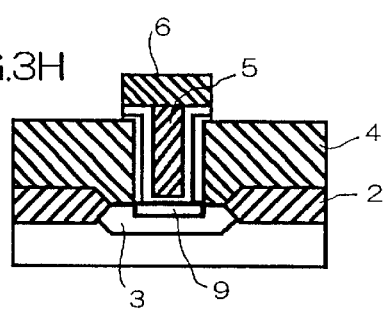

Thus, there is completed a semiconductor device, as illustrated in FIG. 3H.

By using the above-mentioned plasma-enhanced chemical vapor deposition apparatus in accordance with the first embodiment, the susceptor 22 is not exposed directly to the plasma 25. Hence, it is now possible to control a temperature of the susceptor 22, which ensures no dispersion in a temperature of the susceptor 22. As a result, a thin film formed on the silicon substrate 23 through the use of the plasma-enhanced chemical vapor deposition apparatus could have adequate uniformity and enhanced device characteristics and fabrication yield. Since the susceptor cover 28 is composed of ceramics containing no oxygen, no oxygen is absorbed into the titanium film 7, which ensures that a contact resistance is not increased.

(Second Embodiment)

Figure 4:
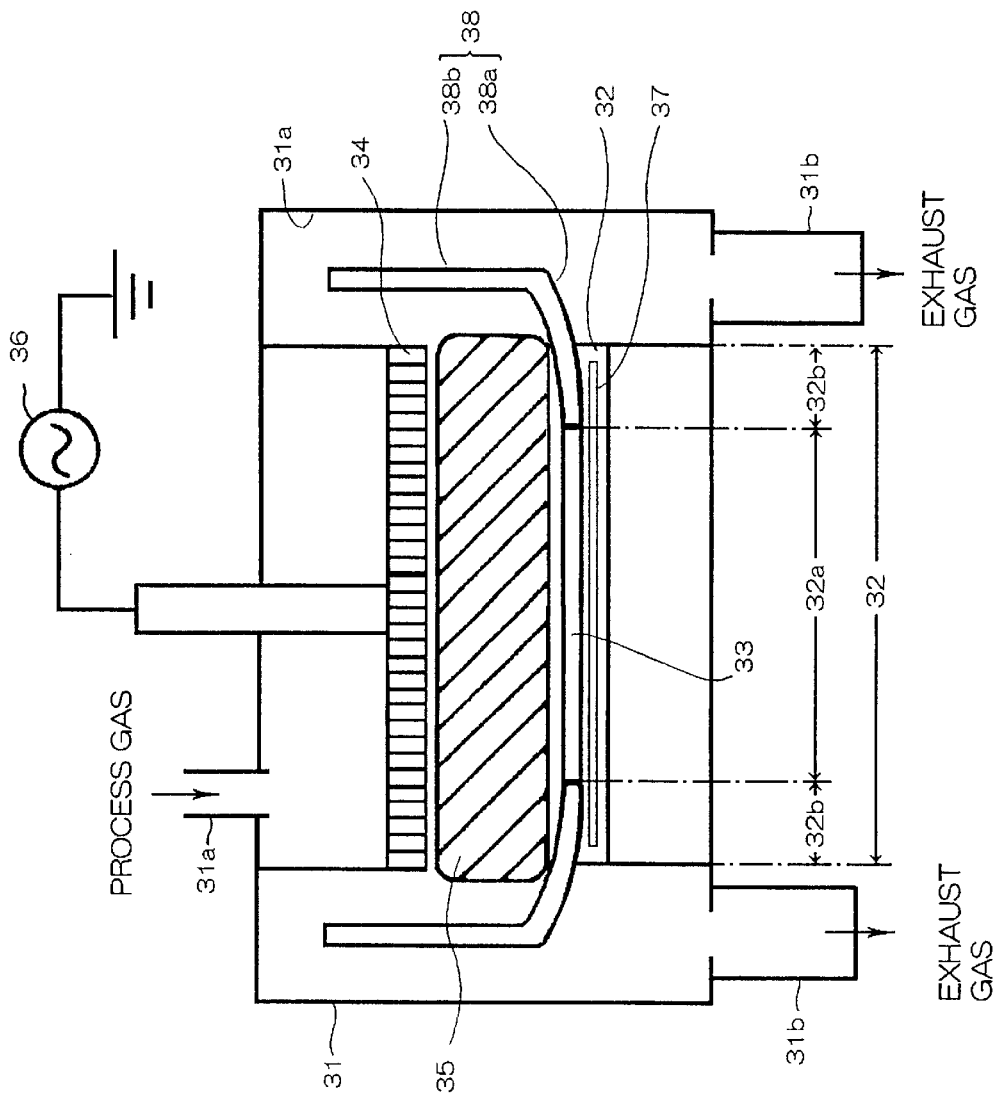
FIG. 4 is a cross-sectional view illustrating a plasma-enhanced chemical vapor deposition apparatus in accordance with the second embodiment of the present invention.

FIG. 4 illustrates a plasma-enhanced chemical vapor deposition apparatus in accordance with the second embodiment of the present invention. The illustrated plasma-enhanced chemical vapor deposition apparatus includes a reaction chamber 31 having an inlet port 31a through a process gas is introduced into the reaction chamber 31, and a pair of outlet ports 31b through which an exhausted gas is discharged, a circular-shaped susceptor 32 composed of metal for placing a silicon substrate 33 thereon, an electrode 34 composed of metal and located in facing relation with the susceptor 32, and cooperating with the susceptor 32 to generate plasma 35 therebetween for forming a thin film on the silicon substrate 33 placed on the susceptor 32, and a radio frequency voltage source 36 for providing a radio frequency voltage to the electrode 34 for generating plasma 35 between the susceptor 32 and the electrode 34. The electrode 34 is formed with a plurality of fine through-holes throughout a thickness thereof. The process gas introduced through the inlet port 31a is led to a space between the susceptor 32 and the electrode 34.

The susceptor 32 is designed to have a first region 32a on which the semiconductor substrate 33 is to be placed and a second region 32b other than the first region 32a. The susceptor 32 is equipped with a heater 37 which is capable of heating the semiconductor substrate 33 up to about 700 degrees centigrade.

The plasma-enhanced chemical vapor deposition apparatus in accordance with the second embodiment is different from the first embodiment in that it includes an inner bell jar 38 in place of the susceptor cover 28. The inner bell jar 38 has a susceptor cover portion 38a covering the second region 32b of the susceptor 32 therewith and a partition portion 38b extending between an inner wall 31a of the reaction chamber 31 and the plasma 25 for partitioning the inner wall 31a of the reaction chamber 31 and the plasma 25 from each other. Namely, the inner bell jar 38 is placed on the susceptor 32 upside down. Hence, a bottom end of the inner bell jar 38 is open to the electrode 34, and a top end is mounted on the susceptor 32.

The inner bell jar 38 is formed at the susceptor cover portion 38a with an opening 38c which is coextensive with the first region 32a of the susceptor 32 and into which the silicon substrate 33 is fit.

The partition portion 38b of the inner bell jar 38 extends in such a 25 manner that it partitions a circumferential end of the electrode 34 from the inner wall 31a of the reaction chamber 31.

In the instant embodiment, the inner bell jar 38 is composed of quartz. The inner bell jar 38 in the instant embodiment ensures that the plasma 35 is not influenced by the inner wall 31a of the reaction chamber 31 composed of metal. The bell jar 38 is designed to have a cylindrical shape, which provides a desired gas distribution. The inner bell jar 38 is designed to have a cross-section similar to a cross-section of the electrode 34.

The partition portion 38b of the inner bell jar 38 may be designed to have a height which does not reach the electrode 34. Even if the partition portion 38b had such a height, the bell jar 38 could provide the above-mentioned advantage that the plasma 35 is not influenced by the inner wall 31a of the reaction chamber 31 composed of metal. However, the partition portion 38b of the inner bell jar 38 in the instant embodiment is designed to have a height beyond the electrode 34, as illustrated in FIG. 4. The extended partition portion 38b of the inner bell jar 38 provides an advantage that abnormal discharge between the electrode 34 and the inner wall 31a of the reaction chamber 31 is prevented.

In the instant embodiment, the susceptor cover portion 38a and the partition portion 38b are integrally formed to thereby constitute the inner bell jar 38. However, it should be noted that the susceptor cover portion 38a and the partition portion 38b may be formed independently of each other, and then coupled with each other. However, it is preferable that the portions 38a and 38b are integrally formed, because the reaction chamber 31 could be more readily cleaned, and maintenance thereof could be more readily conducted.

Hereinbelow is explained a method of forming a thin titanium nitride film on a semiconductor substrate through the use of the above-mentioned plasma-enhanced chemical vapor deposition apparatus illustrated in FIG. 4, with reference to FIGS. 3A to 3H again.

The steps having been explained with reference to FIGS. 3A to 3C are carried out, and then a titanium film 7 is deposited over the product resulting from the steps having been carried out so far, by chemical vapor deposition, as illustrated in FIG. 3D. Simultaneously with the formation of the titanium film 7, there is also formed a titanium silicide layer 9 in the electrically conductive region 3 in the silicon substrate 1.

Then, a titanium nitride film 8 is formed entirely over the titanium film 7 through the use of the plasma-enhanced chemical vapor deposition apparatus illustrated in FIG. 4, as illustrated in FIG. 3E.

The titanium nitride film 8 is formed by a thickness in the range of 5 nm to 50 nm under the following conditions.

Temperature of the silicon substrate 23: 500° C.

Pressure for forming the titanium nitride film 8: 20 Torr

Titanium tetrachloride: 20 sccm

Ammonia: 50 sccm

Nitrogen: 5000 sccm

RF: 200 W

Then, the steps having been explained with reference to FIGS. 3F to 3H are carried out. Thus, there is completed a semiconductor device, as illustrated in FIG. 3H.

The plasma 35 is radiated onto the susceptor cover portion 38a composed of quartz. Since the titanium nitride film 8 grows absorbing oxygen slightly emitted from quartz of which the susceptor cover portion 38 is composed, it is possible to suppress crystal growth or grain growth, which ensures the reduction of crystal grains. As a result, the titanium nitride film 8 could have a considerably improved characteristic as a barrier film. The titanium nitride film 8 would absorb oxygen at a concentration of 1% or smaller; if the plasma-enhanced chemical vapor deposition apparatus was not equipped with the inner bell jar 38, namely, the susceptor 32 was exposed directly to the plasma 35. When the plasma-enhanced chemical vapor deposition apparatus is equipped with the inner bell jar 38 for preventing the susceptor 32 from being exposed directly to the plasma 35, the titanium nitride film 8 preferably absorbs oxygen at a concentration of 5% or greater in order to suppress generation of crystal grains.

The titanium nitride film 8 formed in accordance with the instant embodiment is not only effective as a barrier film when the tungsten plug 5 is formed, but also effective for material which tends to diffuse crystal grains, such as copper (Cu).

In addition, the high barrier characteristic makes it possible to form a barrier film thinner, which is effective for fabricating a semiconductor device in a smaller size. Furthermore, the high barrier characteristic shortens a time necessary for forming a titanium nitride film, which enhances throughput and hence productivity of a semiconductor device.

In the above-mentioned first and second embodiments, the plasma-enhanced chemical vapor deposition apparatuses illustrated in FIGS. 2 and 4 are employed to form a titanium film and a titanium nitride film, respectively; However, it should be noted that the apparatuses may be employed to form a thin film composed of other refractive metals, compounds thereof, or other metal nitrides. While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-83695 filed on Apr. 2, 1997 including specification, claims, drawings and summary is incorporated herein by reference in its entirety.

What is claimed is:

1. A method of carrying out plasma-enhanced chemical vapor deposition, comprising the steps of:

(a) introducing a process gas into a reaction chamber;

(b) generating a plasma between a susceptor having a first surface region on which a semiconductor substrate is placed and a second surface region, other than and continuous with said first surface region, and an electrode located in facing relation with said susceptor so that said second surface region of said susceptor is partitioned from said plasma by a susceptor cover in direct contact with said second surface region; and (c) discharging an exhausted gas out of said reaction chamber.

2. The method as set forth in claim 1, wherein a film containing metal or metal alloy is formed on said semiconductor substrate in said step (b).

3. The method as set forth in claim 2, wherein said metal or metal alloy istitanium or titanium nitride.

4. A method of carrying out plasma-enhanced chemical vapor deposition, comprising the steps of:

(a) introducing a process gas into a reaction chamber;

(b) generating a plasma between a susceptor having a first surface region on which a semiconductor substrate is placed and a second surface region, other than and continuous with said first surface region, and an electrode located in facing relation with said susceptor so that both said second surface region of said susceptor and an inner wall of said reaction chamber are partitioned from said plasma by a bell jar in direct contact with said second surface region; and (c) discharging an exhausted gas out of said reaction chamber.

5. The method as set forth in claim 4, wherein a film containing metal or metal alloy is formed on said semiconductor substrate in said step (b).

6. The method as set forth in claim 5, wherein said metal or metal alloy is titanium or titanium nitride.

7. A method of carrying out plasma-enhanced chemical vapor deposition, comprising the steps of:

(a) introducing a process gas into a reaction chamber;

(b) generating a plasma between a susceptor having a first surface region on which a semiconductor substrate is placed and a second surface region, other than and continuous with said first surface region, and all electrode located in facing relation with said susceptor so that both said second surface region of said susceptor and an inner wall of said reaction chamber are partitioned from said plasma and that an end of said electrode is partitioned from said inner wall of said reaction chamber by a bell jar in direct contact with said second surface region; and (c) discharging an exhausted gas out of said reaction chamber.

8. The method as set forth in claim 7, wherein a film containing metal or metal alloy is formed on said semiconductor substrate in said step (b).

9. The method as set forth in claim 8, wherein said metal or metal alloy is titanium or titanium nitride.

* * * * *

UNITED STATES PATENT AND TRADEMARK OFFICE
CERTIFICATE OF CORRECTION

PATENT NO. : 6,432,493 B1
DATED : August 13, 2002
INVENTOR(S) : Taguwa, Tetsuya

It is certified that error appears in the above-identified patent and that said Letters Patent is hereby corrected as shown below:

Column 10,
Line 17, "istitanium" should be -- is titanium --.
Line 45, "all" should be -- an --.

Signed and Sealed this

Fourth Day of November, 2003

JAMES E. ROGAN
*Director of the United States Patent and Trademark Office*